United States Patent
Jian et al.

(10) Patent No.: US 8,153,709 B2
(45) Date of Patent: Apr. 10, 2012

(54) HALOGEN-FREE PREPREG AND RESIN FOR PREPARING THE SAME

(75) Inventors: Bin Jian, Taoyuan (TW); Li-Chun Chen, Taoyuan (TW)

(73) Assignee: Iteq Corporation, Taoyuan (TW)

( * ) Notice: Subject to any disclaimer, the term of this patent is extended or adjusted under 35 U.S.C. 154(b) by 435 days.

(21) Appl. No.: 12/482,463

(22) Filed: Jun. 11, 2009

(65) Prior Publication Data
US 2010/0155123 A1    Jun. 24, 2010

(30) Foreign Application Priority Data

Dec. 22, 2008   (TW) ................. 97150100 A

(51) Int. Cl.
*C08K 3/36* (2006.01)
*C08K 5/07* (2006.01)
*C08L 63/04* (2006.01)

(52) U.S. Cl. ........ 523/456; 523/454; 523/457; 523/466; 525/481; 525/504; 525/523

(58) Field of Classification Search .......................... None
See application file for complete search history.

(56) References Cited

U.S. PATENT DOCUMENTS

| | | | |
|---|---|---|---|
| 5,648,436 A | 7/1997 | Janowitz et al. | |
| 5,955,184 A | 9/1999 | Honda et al. | |
| 7,521,120 B2 | 4/2009 | Jung et al. | |
| 2007/0299163 A1* | 12/2007 | Hwang et al. | 523/400 |
| 2008/0113184 A1* | 5/2008 | Yoshida et al. | 428/332 |
| 2010/0048766 A1* | 2/2010 | Cheng et al. | 523/451 |

FOREIGN PATENT DOCUMENTS

| | | | |
|---|---|---|---|
| JP | 2001-114996 A | * | 4/2001 |
| JP | 2003-268340 A | * | 9/2003 |
| JP | 2004-107410 A | * | 4/2004 |
| JP | 2007-51212 A | * | 3/2007 |
| TW | 200728425 A | | 8/2007 |

* cited by examiner

*Primary Examiner* — Robert Sellers
(74) *Attorney, Agent, or Firm* — CKC & Partners Co., Ltd.

(57) ABSTRACT

A composition for preparing a halogen-free resin is provided, the composition including a halogen-free phosphorated epoxy, a urethane-modified copolyester, a curing agent, a filler, a surfactant, and a solvent. A halogen-free prepreg is also provided, including a glass fabric cloth and a halogen-free resin layer on the glass fabric. The halogen-free resin layer is made from the foregoing halogen-free resin.

15 Claims, No Drawings

HALOGEN-FREE PREPREG AND RESIN FOR PREPARING THE SAME

RELATED APPLICATIONS

This application claims priority to Taiwan Application Serial Number 97150100, filed Dec. 22, 2008, which is herein incorporated by reference.

BACKGROUND

1. Technical Field

The present invention relates to a prepreg and a resin for preparing the same. More particularly, the present invention relates to a halogen-free prepreg and a halogen-free resin for preparing the same.

2. Description of Related Art

Because technology is progressing continuously, the structure of the circuit board is more and more complicated for different design, different development, or different application of electronic products. The complicated structure of the circuit board, such as multi-layer circuit board, is often used in a printer head, a foldable mobile phone or a portable computer. Usually, the multi-layer circuit board is formed by overlapping several substrates with different features.

The substrate for the circuit board is divided into flexible substrate and rigid substrate. The flexible substrate is made from polyimide (PI), poly(ethylene terephthalate) (PET), poly(ethylene 2,6-naphthalate) (PEN) or a material containing rubber resin. The rigid substrate is made from epoxy resin.

Because the material of the flexible substrate and the rigid substrate is different, the prepreg is used to join the two substrates by thermocompression. However, during the thermocompression process, the resin of the prepreg often overflows from the edges of the two substrates and even more serious for manufacturing the circuit boards of the smaller electronic products. Hence, the reliability of the circuit boards is decreased. According to the standard of the Institute for Interconnecting and Packing Electronic Circuits (IPC), IPC-6013 3.3.1.3, the resin overflow from the edges of the substrates should be smaller than 1.5 mm (millimeter) to meet the reliability and manufacturing requirements.

Besides, since environmental consciousness has increased recently, a halogen-free prepreg used as the adhesive interface between circuit boards has become a standard worldwide.

SUMMARY

A composition for preparing halogen-free resin is provided. The composition includes a halogen-free phosphorated epoxy, a urethane-modified copolyester, a curing agent, a filler, a surfactant and a solvent. The halogen-free phosporated epoxy is 100 parts by weight, the urethane-modified copolyester is from 5 to 15 parts by weight, the curing agent is from 2.5 to 45 parts by weight, the filler is from 10 to 40 parts by weight, the surfactant is from 0.1 to 0.2 parts by weight, and the solvent is from 30 to 60 parts by weight.

A halogen-free prepreg is provided. The halogen-free prepreg includes a fiberglass cloth and a halogen-free resin layer on the fiberglass cloth. The halogen-free resin layer is made from a halogen-free resin prepared by a composition including a halogen-free phosphorated epoxy, a urethane-modified copolyester, a curing agent, a filler, a surfactant and a solvent. The halogen-free phosporated epoxy is 100 parts by weight, the urethane-modified copolyester is from 5 to 15 parts by weight, the curing agent is from 2.5 to 45 parts by weight, the filler is from 10 to 40 parts by weight, the surfactant is from 0.1 to 0.2 parts by weight, and the solvent is from 30 to 60 parts by weight.

A printed circuit board is provided. The printed circuit board includes a first substrate, a second substrate and a halogen-free prepreg between the first substrate and the second substrate for adhering the first substrate and the second substrate. The halogen-free prepreg includes a fiberglass cloth and a halogen-free resin layer on the fiberglass cloth. The halogen-free resin layer is made from a halogen-free resin, and the halogen-free resin is prepared by a composition including a halogen-free phosphorated epoxy, a urethane-modified copolyester, a curing agent, a filler, a surfactant and a solvent. The halogen-free phosphorated epoxy is 100 parts by weight, the urethane-modified copolyester is from 5 to 15 parts by weight, the curing agent is from 2.5 to 45 parts by weight, the filler is from 10 to 40 parts by weight, the surfactant is from 0.1 to 0.2 parts by weight, and the solvent is from 30 to 60 parts by weight.

DETAILED DESCRIPTION

An epoxy prepreg is used as an adhesive interface between a flexible substrate and a rigid substrate. In order to decrease the resin overflow from the substrate edge, a rubber-containing epoxy or a rubber-modified epoxy is added into a major epoxy, which is not modified by rubber. The weight ratio of the rubber-containing epoxy or the rubber-modified epoxy to the major epoxy should be larger than 0.3 for changing the mobility of the major epoxy to decrease the resin overflow from the substrate edges. However, since the ratio described above is greater than 0.3, the thermal stability and the thermal expansion property of the epoxy prepreg is changed. Therefore, the flexible substrate and the rigid substrate are easily deformed during thermocompression process.

Furthermore, the polarity of the solvent used in the rubber-containing epoxy or the rubber-modified epoxy is different from the polarity of the solvent used in the major epoxy. Therefore, the rubber-containing epoxy or the rubber-modified epoxy is difficult to mix with the major epoxy. In other words, the rubber-containing epoxy or the rubber-modified epoxy must be diluted by a lot of the solvent used in the major epoxy to mix with the major epoxy.

In some other cases, urethane is used to be the adhesive interface between flexible printed circuit boards. The urethane also is used to make the flexible substrate of a printed circuit boards. The urethane resin has high viscosity and can be directly coated on the flexible substrate. However, it is hard to reduce the viscosity of the urethane resin. Therefore, it is not suitable to use the urethane resin alone to prepare the prepreg unless epoxy resin is added into the urethane resin. Nevertheless, the polarity difference between urethane and epoxy is great. Thus, if the solvent used in epoxy resin is used to mix urethane and epoxy, a huge amount of solvent is needed. The process is complicated and has a high cost.

Accordingly, a composition for preparing a halogen-free resin is provided in an embodiment of the present invention. The halogen-free resin is used in the impregnated process to make a prepreg. The composition includes a halogen-free phosphorated epoxy, a urethane-modified copolyester, a curing agent, a filler, a surfactant and a solvent.

The halogen-free phosphorated epoxy is the major component in the composition, and is the major reactant for the polymerization and the curing reaction. Since the phosphorated epoxy is halogen-free, the halogen-free resin can comply with the environmental standards in many countries. The phosphorated epoxy can increase the glass transition temperature and the burning resistance of the halogen-free resin. The halogen-free phosphorated epoxy is phosphorated Cresol Novolac Epoxy (commercial name is BEP 330A70) from Chang Chun Plastics Co., LTD, for example. The resin component in BEP 330A70 is 70 wt %.

The urethane-modified copolyester is added for controlling the resin overflow, and the polarity of the urethane-modified copolyester is similar to the polarity of the epoxy. Since the polarity of the urethane-modified copolyester is similar to that of the epoxy, the urethane-modified copolyester can be mixed with the major epoxy without adding a great quantity of solvent. Furthermore, since the expansion coefficient of the halogen-free resin after adding the urethane-modified copolyester is similar to that of the substrates, the substrates are not deformed during the thermocompression process. According to an embodiment, 5 to 15 parts by weight of the urethane-modified copolyester is added into per 100 parts by weight of the major component. For example, the urethane-modified copolyester is UR3500 of TOYOBO CO., LTD; the molecular weight of the copolyester is more than 10000, and the average molecular weight of the copolyester is 15000. The resin component in UR3500 is 40 wt %.

The curing agent above is used to polymerize the halogen-free phosphorated epoxy. The curing agent can be a novolac curing agent, a dicyandiamide or a combination thereof, for example. The novolac curing agent is a phenyl novolac, for example, and the resin component in phenyl novolac is 60 wt %. From 25 to 45 parts by weight of the novolac curing agent is added into per 100 parts by weight of the major component. Alternatively, from 2.5 to 4.0 parts by weight of the dicyandiamide is added into per 100 parts by weight of the major component.

The filler can be silicon dioxide, aluminum hydroxide, talcum powder, mica or a combination thereof, for example. The filler decreases the expansion coefficient of the halogen-free resin and increases the burning resistance and the heat resistance of the halogen-free resin. From 10 to 40 parts by weight of the filler is added into per 100 parts by weight of the major component.

The filler needs to be used in coordination with the surfactant. The surfactant increases the interaction among the filler, the fiberglass cloth and the epoxy. The surfactant is a silane coupling agent. From 0.1 to 0.2 parts by weight of the surfactant is added into per 100 parts by weight of the major component.

All components in the composition for preparing the halogen-free resin described above are dispersed in a common solvent to mix together. The solvent is cyclohexanone, methyl ethyl ketone, or a combination thereof, for example. From 30 to 60 parts by weight of the solvent is added into per 100 parts by weight of the major component.

In addition to the halogen-free phosphorated epoxy being the major component of the composition, an epoxy having four functional groups and a bisphenol-A novolac epoxy may also be added into the composition. The halogen-free phosphorated epoxy mixed with the epoxy having four functional groups can increase the glass transition temperature of the halogen-free resin and make the halogen-free resin have ultraviolet resistance. From 5 to 10 parts by weight of the epoxy having four functional groups is added into per 100 parts by weight of the major epoxy. The epoxy having four functional groups can be TNE 190A70 from Chang Chun Plastics Co., LTD, and the resin component in TNE 190A70 is 70 wt %, for example.

The halogen-free phosphorated epoxy mixed with the bisphenol-A novolac epoxy can increase the glass transition temperature and the heat resistance of the halogen-free resin. From 5 to 10 parts by weight of the bisphenol-A novolac epoxy resin is added into per 100 parts by weight of the major epoxy. The bisphenol-A novolac epoxy is BENA70 from Chang Chun Plastics Co., LTD, and the resin component in BENA70 is 70 wt %, for example.

In an embodiment, the composition also includes a trace amount of catalyst to catalyze the polymerization reaction of epoxy during the curing reaction to shorten the curing time of the halogen-free resin. The catalyst is 2-methylimidazole, for example.

According to an example of the present invention, 100 parts by weight of the halogen-free phosphorated epoxy is mixed with 5 parts by weight of the epoxy having four functional groups and 6.2 parts by weight of the bisphenol-A novolac epoxy to be a major component in the composition. The foregoing halogen-free phosphorated epoxy is BEP 33A70 from Chang Chun Plastics Co., LTD, for example, and the resin component in the BEP 33A70 is 70 wt %. The epoxy having four functional groups is TNE 190A70 from Chang Chun Plastics Co., LTD, for example, and the resin component in the TNE 190A70 is 70 wt %. The bisphenol-A novolac epoxy is BENA70 from Chang Chun Plastics Co., LTD, for example, and the resin component in BENA70 is 70 wt %.

Next, 100 parts by weight of the major component is mixed with 10 parts by weight of the urethane-modified copolyester (UR3500 of TOYOBO CO., LTD, the molecular weight is more than 10000, and the average molecular weight is 15000. The resin component in UR3500 is 40 wt %.), 38 parts by weight of the novolac curing agent, 0.09 parts by weight of the 2-methylimidazole, 25 parts by weight of the silicon dioxide, a trace amount of silane coupling agent, and 43 parts by weight of the cyclohexanone. All components described above are stirred for 180 minutes by a stirring apparatus at room temperature to form a halogen-free resin. The halogen-free resin is used in the impregnation process to make a halogen-free prepreg.

A halogen-free prepreg includes a fiberglass cloth and a halogen-free resin layer on the fiberglass cloth. The halogen-free resin layer is made from the halogen-free resin described above. The fiberglass cloth is impregnated with the halogen-free resin by a roller impregnating machine. Then, the fiberglass cloth impregnated with the halogen-free resin is heated and dried at 150-200° C. to form a halogen-free prepreg. The thickness of the fiberglass cloth is 0.04-0.06 mm, and the weight of the fiberglass cloth is 46-50 gram per square meter.

The various properties of the halogen-free prepreg are tested according to the IPC-TM-650, a standard of the Institute for Interconnecting and Packing Electronic Circuits. The various tested properties include the resin overflow, the heat resistance and the electronic insulation of the prepreg. The test results are shown in Table 1.

Table 1

TABLE 1

| Properties | Measurement values | Test method (IPC-TM-650) |
| --- | --- | --- |
| Resin Content | 63% | 2.3.16.1 |
| Resin Flow | <2% | 2.3.17 |
| Circular Flow | <20 mil | 2.3.17.2 |
| Glass Transition Temperature | 155° C. | 2.4.25 C. |
| Decomposition Temperature | 350° C. | 2.4.24.6 |
| Time to Delamination (T-288) | >60 min | 2.4.24.1 |
| Solder Float at 288° C. | >10 min | 2.4.13 |
| Dielectric Constant at 10 MHz | 4.20 | 2.5.5 |
| Dielectric Loss Factor at 10 MHz | 0.018 | 2.5.5 |

As shown in Table 1, the resin content is tested according to the IPC-TM 650 2.3.16.1, and the resin content of the halogen-free prepreg is 63%. The resin flow and the circular flow indicate the resin flow phenomenon after the substrates are thermocompressed, and the lower value indicates the less overflow of the resin from the edges of the thermocompressed substrates. The resin flow and the circular flow of the halogen-free prepreg are tested according to the IPC-TM 650 2.3.17. The resin flow is less than 2% and the circular flow is less than 20 mil (1 mil=0.0254 mm).

Glass transition temperature (Tg), decomposition temperature (Td), time to delamination and solder float at 288° C. indicate the heat resistance of the halogen-free prepreg. The higher temperature of Tg and Td, the longer time of delamination and solder float at 288° C. indicate the better heat resistance and the better burning resistance of the halogen-free prepreg. The Tg of the halogen-free prepreg is 155° C. determined by the differential scanning calorimetry (DSC) according to the IPC-TM-650 2.4.25C. The Td of the halogen-free prepreg is 350° C. determined by the thermal gravimetric analysis (TGA) according to the IPC-TM-650 2.4.24.6. Further, the delamination time of the halogen-free prepreg at 288° C. is longer than 60 minutes, which is determined by the thermo-mechanical analysis (TMA) according to the IPC-TM-650 2.4.24.1. The time of the solder float at 288° C. of the halogen-free prepreg is longer than 10 minutes, which is determined according to the IPC-TM-650 2.4.13.

The dielectric constant indicates the insulation of the halogen-free prepreg, and the lower value indicates the better insulation of the halogen-free prepreg. And the dielectric loss factor indicates the absorption of a certain range of a microwave by a material under a certain temperature. In the standard of the communicational products, the lower value of the dielectric loss factor is better. The dielectric constant of the halogen-free prepreg is 4.2 and the dielectric loss factor of the halogen-free prepreg is 0.018. Both are determined according to the IPC-TM-650 2.5.5.

According to the results of Table 1, the halogen-free prepreg is burning resistance and heat resistance. The resin overflow of the halogen-free prepreg is less than 20 mil during the thermocompression process of the flexible and the rigid substrates. Therefore, the halogen-free prepreg meets the standard of the IPC.

In addition, the halogen-free prepreg is thermocompressed with a 1 oz copper or a 1 oz brown oxide copper to test the adhesion strength of the halogen-free prepreg according to the IPC-TM-650 2.4.8. The adhesion strength of the halogen-free prepreg with the 1 oz copper is 8.0 pound/inch (lb/in), and the adhesion strength of the halogen-free bonding with the 1 oz brown oxide copper is 3.5 lb/in.

The foregoing halogen-free prepreg is used for adhering the substrates of the circuit boards. Another embodiment of the present invention provides a printed circuit board, which includes a first substrate, a second substrate and a halogen-free prepreg between the first and the second substrates. The halogen-free prepreg is used to be an interface for adhering the first substrate and the second substrate. The first substrate above can be a flexible substrate or a rigid substrate, and the second substrate can also be a flexible substrate or a rigid substrate.

What is claimed is:

1. A composition for preparing a halogen-free resin, the composition comprising:
    100 parts by weight of a halogen-free phosphorated epoxy;
    from 5 to 15 parts by weight of a urethane-modified copolyester;
    from 2.5 to 45 parts by weight of a curing agent;
    from 10 to 40 parts by weight of a filler;
    from 0.1 to 0.2 parts by weight of a surfactant; and
    from 30 to 60 parts by weight of a solvent.

2. The composition of claim 1, further comprising an epoxy having four functional groups.

3. The composition of claim 2, wherein the epoxy having four functional groups is present in an amount of 5 parts by weight.

4. The composition of claim 1, further comprising a bisphenol-A novolac epoxy.

5. The composition of claim 4, wherein the bisphenol-A novolac epoxy is present in an amount of 6.2 parts by weight.

6. The composition of claim 1, wherein the urethane-modified copolyester is present in an amount of 10 parts by weight.

7. The composition of claim 1, wherein the curing agent is selected from the group consisting of novolac curing agent, dicyandiamide, and a combination thereof.

8. The composition of claim 7, wherein the novolac curing agent is present in an amount of 38 parts by weight.

9. The composition of claim 7, wherein the dicyandiamide is present in an amount of 3.5 parts by weight.

10. The composition of claim 1, wherein the filler is selected from the group consisting of silicon dioxide, aluminum hydroxide, talcum powder, mica, and a combination thereof.

11. The composition of claim 1, wherein the surfactant is a silane coupling agent.

12. The composition of claim 1, wherein the solvent is selected from the group consisting of cyclohexanone, methyl ethyl ketone, and a combination thereof.

13. The composition of claim 1, wherein the solvent is present in an amount of 43 parts by weight.

14. The composition of claim 1, further comprising a catalyst for catalyzing a polymerization reaction of epoxy.

15. The composition of claim 14, wherein the catalyst is 2-methylimidazole.

* * * * *